(12) United States Patent
Tsuchiya

(10) Patent No.: US 8,416,015 B2
(45) Date of Patent: Apr. 9, 2013

(54) ACTIVE RECTIFYING APPARATUS

(75) Inventor: Chikara Tsuchiya, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 59 days.

(21) Appl. No.: 13/078,386

(22) Filed: Apr. 1, 2011

(65) Prior Publication Data

US 2011/0181218 A1 Jul. 28, 2011

Related U.S. Application Data

(63) Continuation-in-part of application No. 12/972,712, filed on Dec. 20, 2010, now abandoned.

(30) Foreign Application Priority Data

Dec. 22, 2009 (JP) ................................. 2009-290304
Dec. 6, 2010 (JP) ................................. 2010-271891

(51) Int. Cl.
 *H03K 17/74* (2006.01)
 *H03G 11/02* (2006.01)
(52) U.S. Cl.
 USPC ........... 327/583; 327/494; 327/587; 363/126; 363/127

(58) Field of Classification Search ........................ None
 See application file for complete search history.

(56) References Cited

U.S. PATENT DOCUMENTS

| 5,506,527 | A | 4/1996 | Rudolph et al. | |
|---|---|---|---|---|
| 7,199,636 | B2 * | 4/2007 | Oswald et al. | 327/325 |
| 8,031,498 | B2 * | 10/2011 | Deboy et al. | 363/127 |
| 2009/0140707 | A1 * | 6/2009 | Deboy | 323/282 |

FOREIGN PATENT DOCUMENTS

JP     07-297699     11/1995

* cited by examiner

*Primary Examiner* — Lincoln Donovan
*Assistant Examiner* — Terry L Englund
(74) *Attorney, Agent, or Firm* — Fujitsu Patent Center

(57) ABSTRACT

A semiconductor apparatus includes: a first transistor; a second transistor having a higher withstand voltage than the first transistor, a source of the second transistor coupled to a drain of the first transistor, a gate of the second transistor coupled to a source of the first transistor; a third transistor having a higher withstand voltage than the first transistor and a drain of the third transistor coupled to a drain of the second transistor; and a comparator that compares a source voltage of the first transistor with a source voltage of the third transistor, and controls a gate voltage of the first transistor.

22 Claims, 16 Drawing Sheets

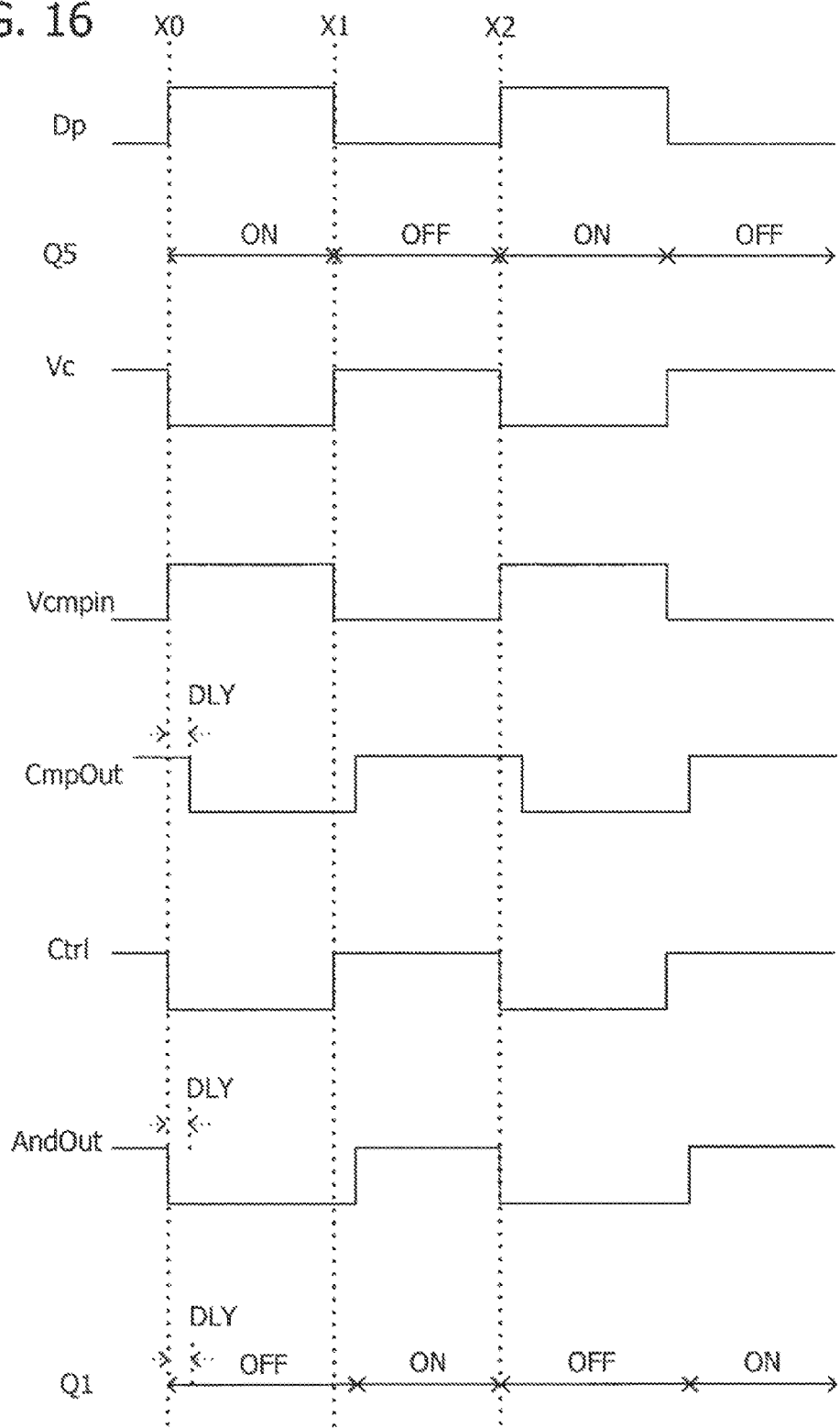

ACTIVE RECTIFYING APPARATUS

CROSS-REFERENCE TO RELATED APPLICATIONS

This application is a continuation-in-part of prior application Ser. No. 12/972,712, filed on Dec. 20, 2010, which has been abandoned. This application is based upon and claims the benefit of priority of the prior Japanese Patent Application No. 2009-290304 filed on Dec. 22, 2009, and the prior Japanese Patent Application No. 2010-271891, filed on Dec. 6, 2010, the entire contents of which are incorporated herein by reference.

BACKGROUND

1. Field

The embodiments discussed herein relate to a semiconductor apparatus.

2. Description of Related Art

A rectifier device includes a diode in which a p-type semiconductor and a n-type semiconductor are joined. A diode, which requires a forward voltage of, for example, 0.7 V, may have a large power loss.

A related technology is disclosed in, for example, Japanese Laid-open Patent Publication No. H7-297699.

SUMMARY

According to one aspect of the embodiments, a semiconductor apparatus includes: a first transistor; a second transistor having a higher withstand voltage than the first transistor, a source of the second transistor coupled to a drain of the first transistor, a gate of the second transistor coupled to a source of the first transistor; a third transistor having a higher withstand voltage than the first transistor and a drain of the third transistor coupled to a drain of the second transistor; and a comparator that compares a source voltage of the first transistor with a source voltage of the third transistor, and controls a voltage of a gate of the first transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 16 explains operation of the power supply circuit of FIG. 15.

DESCRIPTION OF EMBODIMENTS

Power consumption may be reduced by detecting the voltage between the terminals of a diode and short-circuiting the terminals of the diode using a switch during forward conduction.

Figure 1:
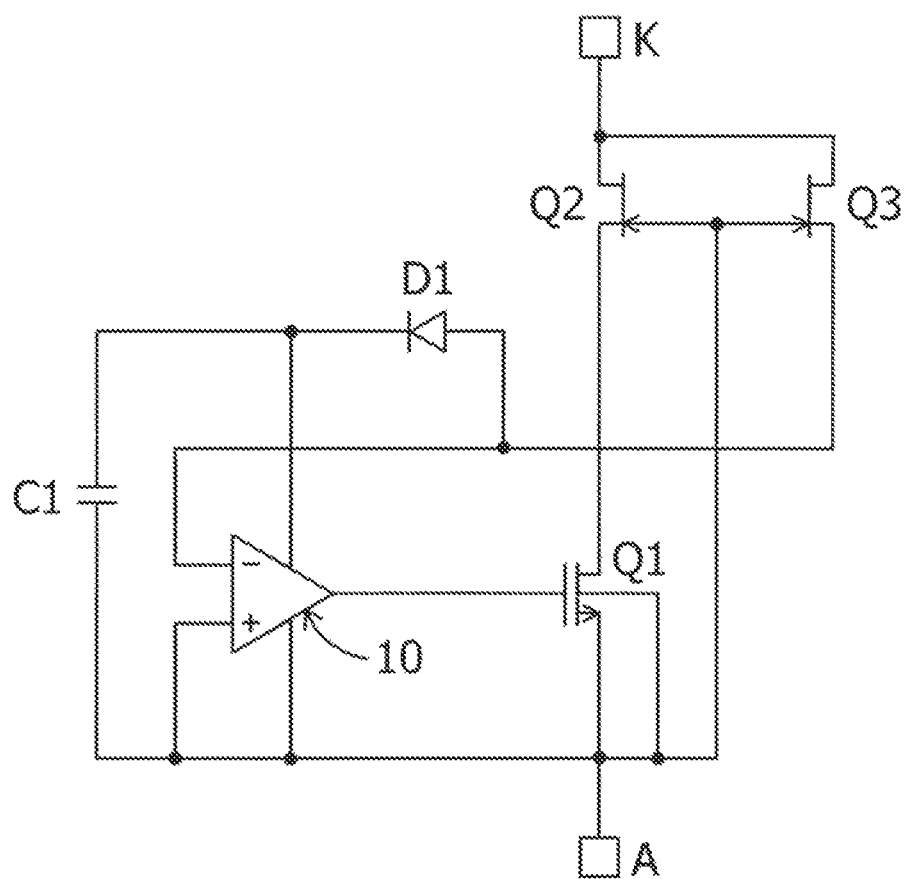
FIG. 1 illustrates an exemplary semiconductor apparatus.
Figure 2:
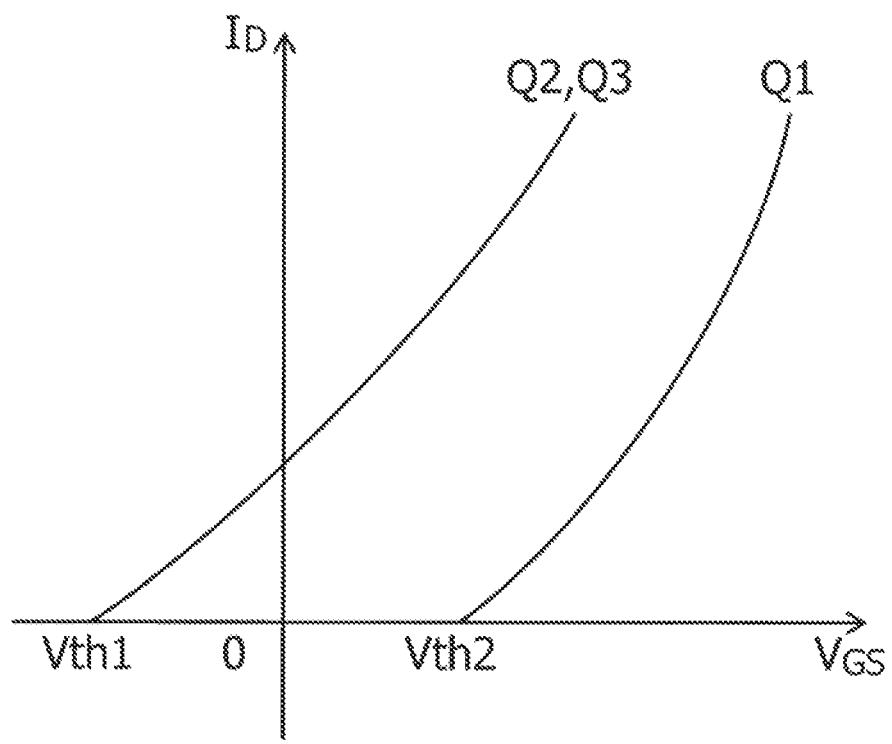
FIG. 2 illustrates exemplary characteristics of a transistor.

FIG. 1 illustrates an exemplary semiconductor apparatus. The semiconductor apparatus illustrated in FIG. 1 includes transistors Q1, Q2, and Q3, a comparator 10, a diode D1, and a capacitor C1. FIG. 2 illustrates exemplary characteristics of transistors. Referring to FIG. 2, the transistor Q1 may be a normally-off enhancement transistor, and the transistors Q2 and Q3 may be normally-on depletion mode transistors. The transistors Q2 and Q3 may be high-voltage (several hundreds to a thousand volts, for example) transistors, in comparison with the transistor Q1. For example, the transistor Q1 may by an n-channel silicon MOSFET, and the transistors Q2 and Q3 may be high electron mobility transistors (HEMTs) including a wide band gap semiconductor such as gallium nitride (GaN). The comparator 10 includes a non-inverting input terminal and an inverting input terminal. The comparator 10 outputs a low level when a voltage applied to the inverting input terminal is higher than a voltage applied to the non-inverting input terminal and outputs a high level when a voltage applied to the inverting input terminal is lower than a voltage applied to the non-inverting input terminal.

The source of the transistor Q2 is coupled to the drain of the transistor Q1, the gate of the transistor Q2 is coupled to the source of the transistor Q1, and the drain of the transistor Q2 corresponds to a cathode K. The drain and gate of the transistor Q3 are respectively coupled to the drain and gate of the transistor Q2, and the source of the transistor Q3 is coupled to the anode of the diode D1 and the inverting input terminal of the comparator 10. The cathode of the diode D1 is coupled to the power input terminal of the comparator 10 and the capacitor C1. The source of the transistor Q1 is coupled to the back gate, the power input terminal of the comparator 10, the non-inverting input terminal of the comparator 10, and the capacitor C1, and may correspond to an anode A. The output terminal of the comparator 10 is coupled to the gate of the transistor Q1.

The semiconductor apparatus illustrated in FIG. 1 performs a rectifying operation. For example, the semiconductor apparatus decreases or blocks a current that flows when a higher voltage is applied to the cathode K side, and passes a current therethrough when a higher voltage is applied to the anode A side. The anode A may be the ground. When a high positive voltage is applied to the cathode K, the source voltages of the depletion mode transistors Q2 and Q3 increase, and the transistors Q2 and Q3 operate so as not to pass drain currents ID therethrough. Referring to FIG. 2, when the transistors Q2 and Q3 have a negative threshold voltage Vth1 and the drain currents ID are zero, the gate voltage of the transistors Q2 and Q3 is lower than the source voltage by the absolute value |Vth1| of the threshold voltage Vth1. Since the gates of the transistors Q2 and Q3, which are coupled to the anode A, are at the ground level, a voltage having increased to the absolute value |Vth1| of the threshold voltage Vth1 is generated at the sources of the transistors Q2 and Q3. The capacitor C1 is charged through the diode D1. Since a positive voltage is applied to the inverting input terminal of the comparator 10, the output of the comparator 10 is at the ground level, whereby the transistor Q1 turns off.

When a negative voltage is applied to the cathode K, the source voltage of the depletion mode transistors Q2 and Q3 becomes negative, and the transistors Q2 and Q3 operate so as to pass the drain currents ID therethrough. Since a negative voltage is applied to the inverting input terminal of the comparator 10, the output of the comparator 10 becomes positive, whereby the transistor Q1 turns on. A current for making the transistor Q1 turn on is supplied from the capacitor C1, and the diode D1 decreases or blocks a reverse current.

The semiconductor apparatus illustrated in FIG. 1 may be a diode which allows a current to flow therethrough when a negative voltage is applied to the cathode K side. The transistors Q2 and Q3 may be high-voltage HEMTs, whereby a withstand voltage characteristic in reverse biasing is increased (high-voltage characteristic). In reverse biasing in which a high positive voltage is applied to the cathode K, a voltage generated at the sources of the transistors Q2 and Q3 may be a voltage which has increased up to the absolute value |Vth1| of the threshold voltage Vth1, for example, 2 to 3 V. The transistor Q1 may be a low-voltage silicon MOSFET, whereby the on-resistance may be decreased. The resistance during forward biasing is lowered and power loss is decreased. Further, since minor carriers are not used, high-speed operation and high-frequency rectification may be performed.

The source of the transistor Q2 may be input to the comparator 10 when the transistor Q3 is not provided. For instance, in FIG. 1, when the source of the transistor Q2 is input to the comparator 10, if the on-resistance of the transistor Q1 is small, the voltage input to the respective input terminals of the comparator 10 become close to each other, whereby the operation of the comparator 10 may become unstable. The operation of the comparator 10 is stabilized by the transistor Q3 for monitoring. A current of, for example, 100 A may flow through the transistor Q2. A current flowing through the transistor Q3 is smaller than that of the transistor Q2. Hence, the size of the transistor Q3 may be smaller than that of the transistor Q2, whereby the chip size may be reduced.

When a high positive voltage is applied to the cathode K, the capacitor C1 is charged, and when a negative voltage is applied to the cathode K, the diode D1 decreases or blocks a reverse current, whereby electric charges are supplied to the comparator 10 from the capacitor C1. Consequently, when an input to the anode A and the cathode K is an AC input in which positive and negative currents are alternately repeated, self-sufficient operations are performed even though a power supply for the comparator 10 is not provided.

Figure 3:
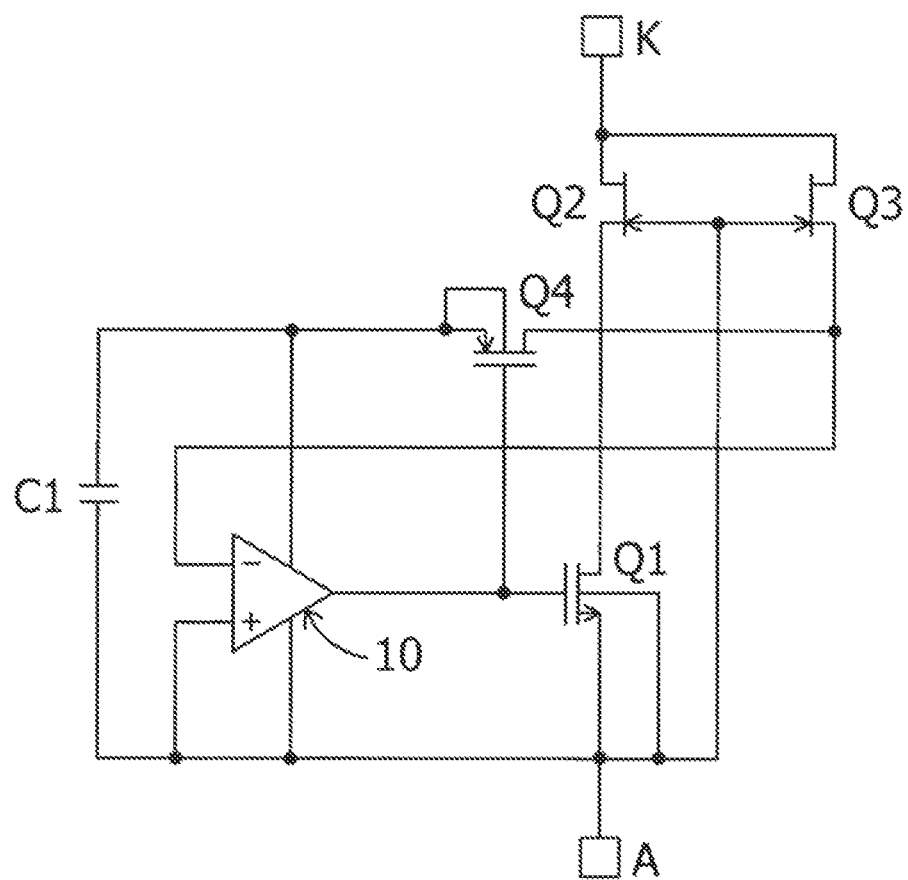
FIG. 3 illustrates an exemplary semiconductor apparatus.

FIG. 3 illustrates an exemplary semiconductor apparatus. In the semiconductor apparatus illustrated in FIG. 3, the diode D1 of the semiconductor apparatus illustrated in FIG. 1 may be replaced by a transistor Q4. The transistor Q4 may be, for example, a p-channel silicon MOSFET. The drain of the transistor Q4 is coupled the source of the transistor Q3, the source of the transistor Q4 is coupled to the power input terminal of the comparator 10 and the capacitor C1, and the gate of the transistor Q4 is coupled to the output terminal of the comparator 10.

When the anode A is at the ground level, if a high positive voltage is applied to the cathode K, the output level of the comparator 10 becomes the ground level, whereby the transistor Q4 turns on. When a negative voltage is applied to the cathode K, the output of the comparator 10 becomes positive, whereby the transistor Q4 turns off. The transistor Q4 illustrated in FIG. 3 may have a function substantially the same as or similar to the function of the diode D1 illustrated in FIG. 1. Since the transistor Q4 is used instead of the diode D1, the forward voltage drop caused by the diode D1 is decreased. Hence, the voltage generated at the source of the transistor Q3 may be utilized as a power source for the comparator 10 without a loss.

Figure 4:
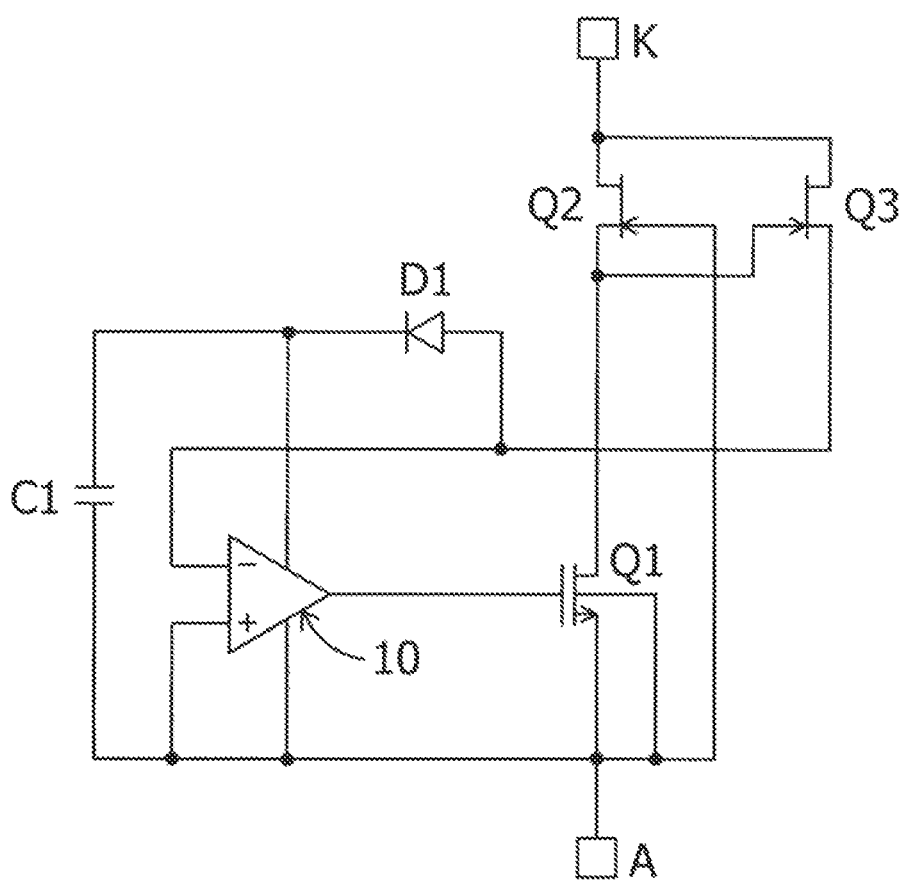
FIG. 4 illustrates an exemplary semiconductor apparatus.

FIG. 4 illustrates an exemplary semiconductor apparatus. In the semiconductor apparatus illustrated in FIG. 4, the gate of the transistor Q3 is coupled to the source of the transistor Q2. Since the gate of the transistor Q3 is coupled to the source of the transistor Q2, when a high positive voltage is applied to the cathode K and the capacitor C1 is charged, a voltage having increased to twice the absolute value |Vth1| of the threshold voltage Vth1 is generated at the source of the transistor Q3 with the anode A being the reference voltage. In the semiconductor apparatus illustrated in FIG. 4, a sufficient voltage for the comparator 10 is ensured, whereby the capability of driving the transistor Q1 is improved.

Figure 5:
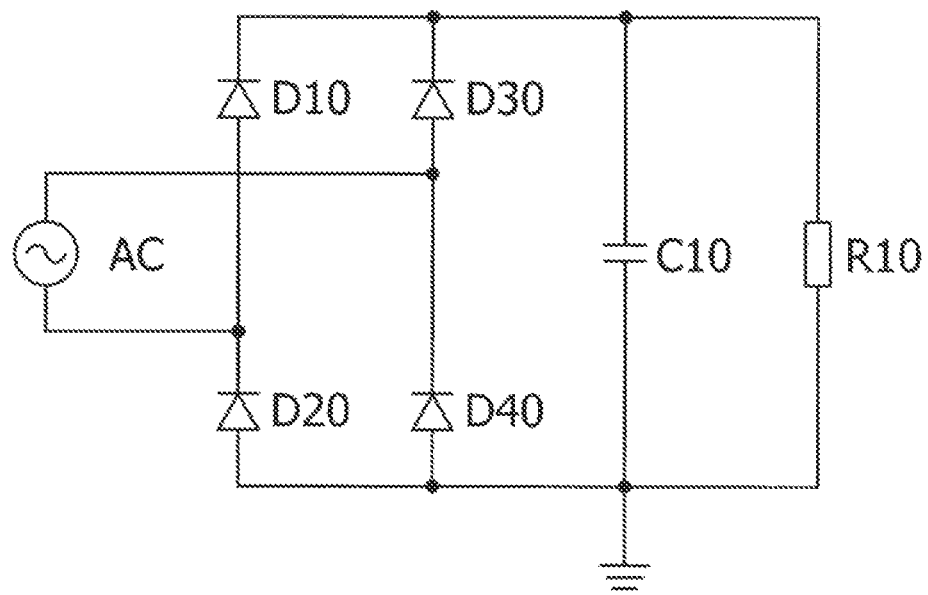
FIG. 5 illustrates an exemplary diode bridge circuit.

FIG. 5 illustrates an exemplary diode bridge rectifying circuit that performs a full-wave rectification, with the diode being incorporated in the bridge circuit. Referring to FIG. 5, during the positive half cycle of an AC power supply output, diodes D30 and D20 conduct, and a current flows through the diode D30, a load R10, and the diode D20. During the negative half cycle of the AC power supply output, diodes D10 and D40 conduct, and a current flows through the diode D10, the load R10, and the diode D40. A capacitor C10 smoothes the voltage. A DC current to be applied to the load R10 is obtained from the AC power supply.

The semiconductor apparatuses illustrated in FIGS. 1, 3, and 4 have a function of a diode, and may operate self-sufficiently without being supplied with power. The semiconductor apparatuses illustrated in FIGS. 1, 3, and 4 may be applied to the diodes D10 to D40 illustrated in FIG. 5. The diodes D10 and D20 or the diodes D30 and D40 may be turned on substantially at the same time, depending on the offset voltage of the comparator 10, whereby a reverse current may flow.

Figure 6:
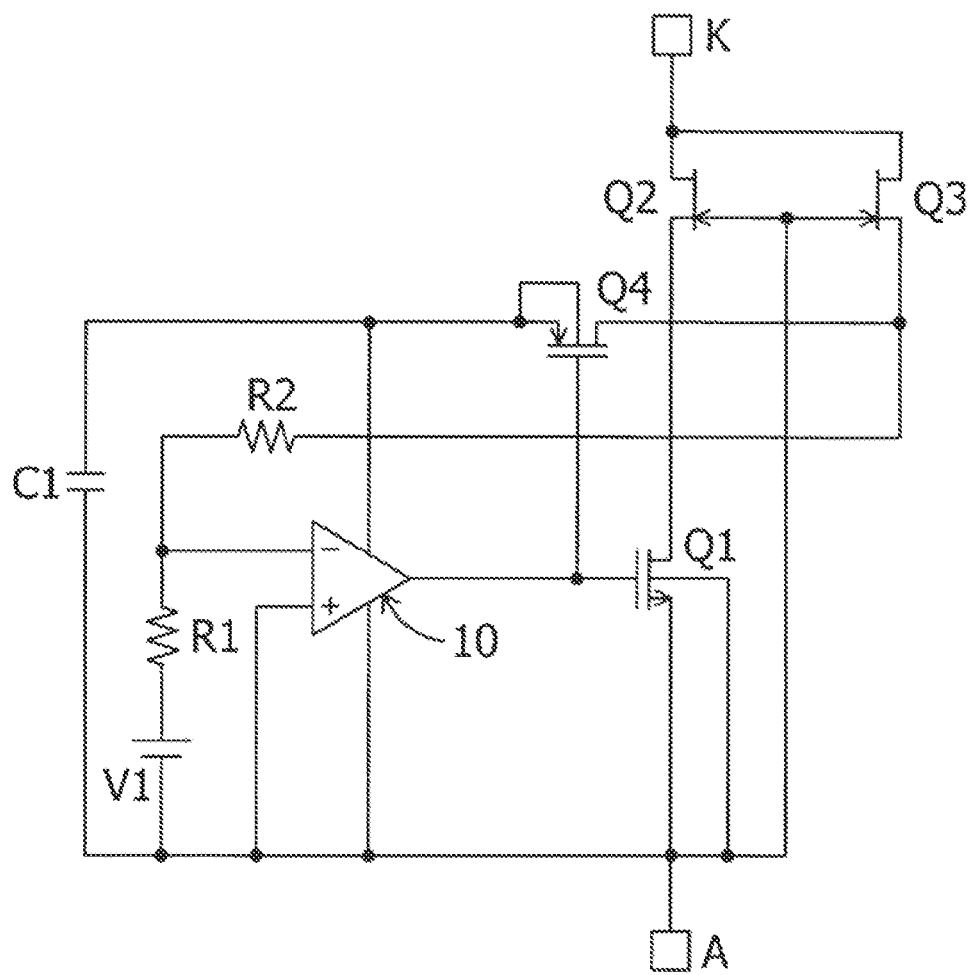
FIG. 6 illustrates an exemplary semiconductor apparatus.

FIG. 6 illustrates an exemplary semiconductor apparatus. The negative terminal of a voltage source that supplies a voltage V1 is coupled to the source of the transistor Q1. Resistors R1 and R2 are coupled in series between the positive terminal of the voltage source that supplies the voltage V1 and the source of the transistor Q3. A comparator 10 may be used and the non-inverting input terminal of the comparator 10 is coupled to the source of the transistor Q1, the inverting input terminal is coupled to a divided voltage point between the resistors R1 and R2. In FIG. 6, components which are substantially the same as those in FIG. 3 are denoted by the same reference symbols, and the descriptions thereof may be omitted or reduced.

The anode A may be the ground. When the cathode K has a positive voltage with respect to the anode A, since a positive voltage is applied to the inverting input terminal of the comparator 10, the comparator 10 turns off the transistor Q1. When a negative voltage is applied to the cathode K with respect to the anode A, the comparator 10 makes the inverting input terminal level the ground level similarly to the non-inverting input terminal. The voltage of the cathode K may be Vk, and a current may flow from the voltage source that supplies the voltage V1 to the source of the transistor Q3 through the resistors R1 and R2. Since the current does not flow into the inverting input terminal of the comparator 10, a current (V1−0)/R1 flowing through the resistor R1 is substantially equal to a current (0−Vk)/R2 flowing through the resistor R2. Since (V1−0)/R1=(0−Vk)/R2, the voltage of the cathode Vk=−V1×R2/R1. Hence, when a negative voltage is applied to the cathode K with respect to the anode A, the comparator 10 turns on the transistor Q1 such that the voltage of the cathode K becomes −V1×R2/R1, and the transistor Q1 is turned off when the voltage of the cathode K exceeds −V1×R2/R1.

When the semiconductor apparatus illustrated in FIG. 6 is applied in the diode bridge rectifying circuit illustrated in FIG. 5, the following configuration is employed. That is, the semiconductor apparatuses illustrated in FIG. 6 are respectively provided between four nodes of the diode bridge rectifying circuit.

The semiconductor apparatus illustrated in FIG. 6 may not be turned on unless the voltage of the cathode K becomes negative with respect to the anode A. For example, in the diode bridge illustrated in FIG. 5, the diode D10 and the diode D20, or the diode D30 and the diode D40 may not be turned on substantially at the same time.

Figure 7:
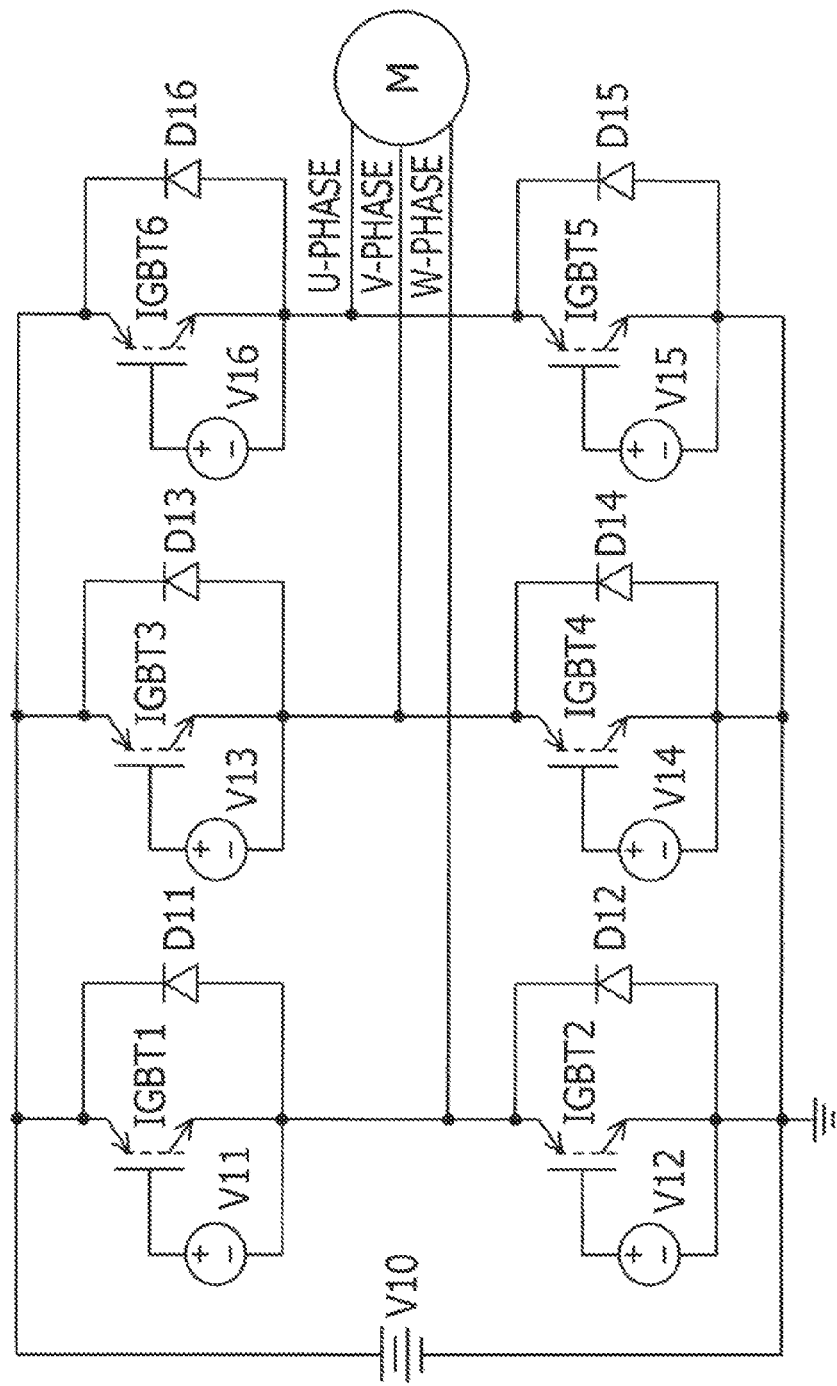
FIG. 7 illustrates an exemplary drive circuit.

FIG. 7 illustrates an exemplary drive circuit. The drive circuit illustrated in FIG. 7 may be a drive circuit for a three-phase motor. Insulated gate bipolar transistors (IGBTs) are coupled such that a high voltage V10 or the ground voltage is applied to each of the U-phase, V-phase, and W-phase. Voltages V11 to V16 are applied to respective control terminals IGBT1 to IGBT6 with pulse width modulation (PWM) control, whereby the rotational speed of a motor M is controlled. Diodes D11 to D16 may be arranged in parallel with each of the IGBT1 to IGBT6.

When the IGBT is turned off, since the rotating motor M works as a generator, a current flows in a direction opposite to the direction at the time when the IGBT is turned on. While the IGBT is off, a current may not flow from an emitter E to a collector C. Hence, referring to FIG. 8, for example, a diode D having substantially the same current capacity as the IGBT may be arranged in parallel with each of the IGBTs.

Figure 8:
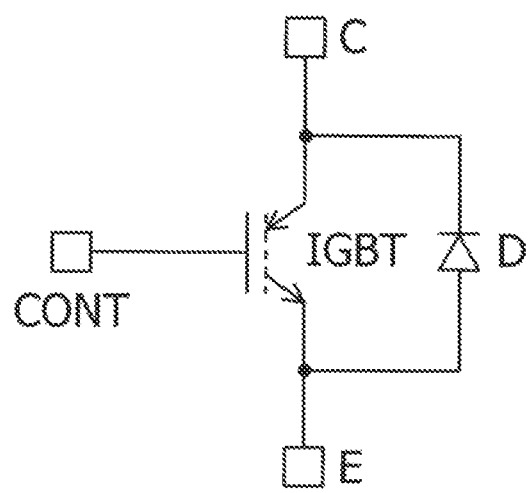
FIG. 8 illustrates an exemplary diode.
Figure 9:
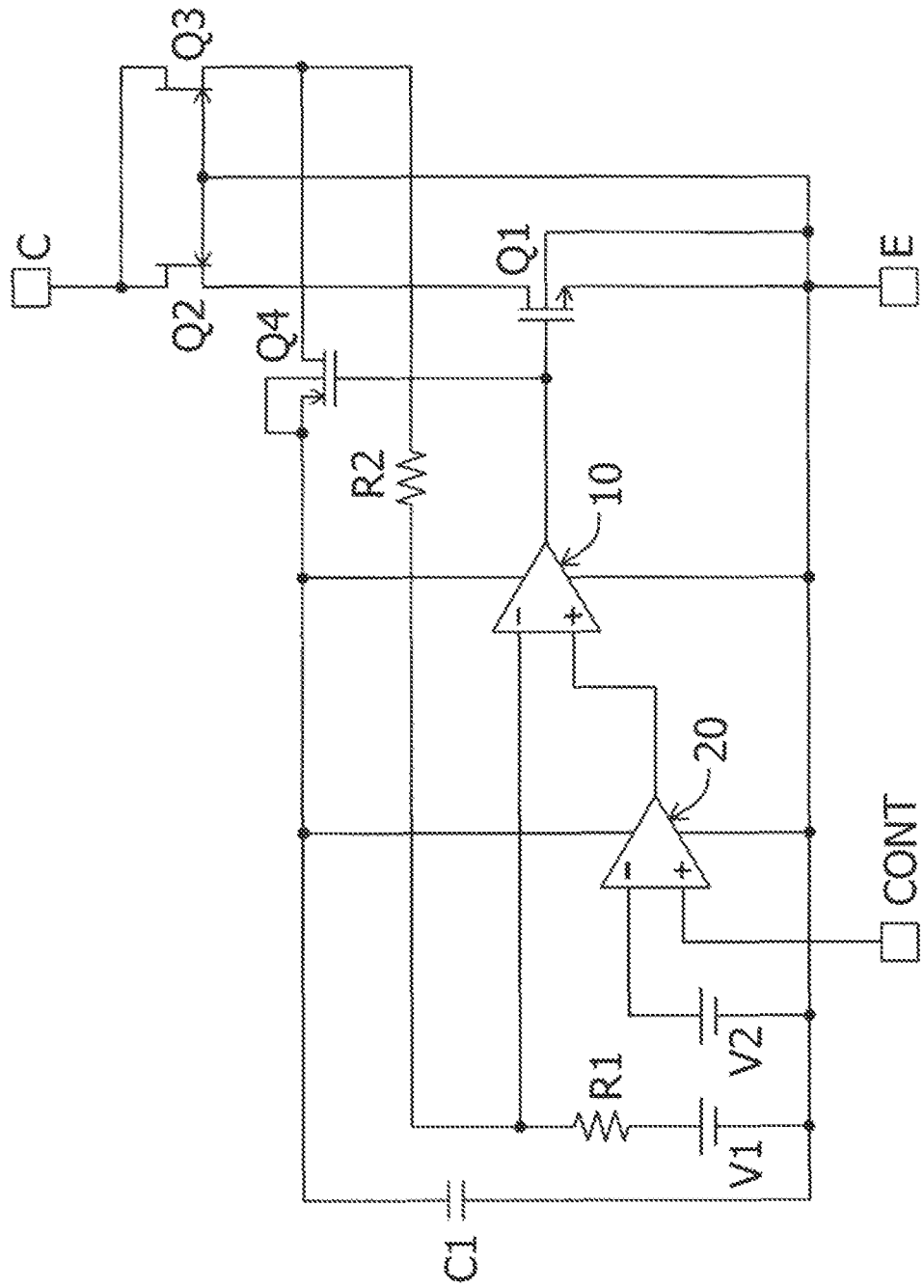
FIG. 9 illustrates an exemplary semiconductor apparatus.

FIG. 9 illustrates an exemplary semiconductor apparatus. The semiconductor apparatus illustrated in FIG. 9 may correspond to the parallel connection of an IGBT and a diode illustrated in FIG. 8. The power input terminals of a comparator 20 are respectively coupled in common with those of the comparator 10. The negative terminal of a voltage source that supplies a voltage V2 is coupled to the source of the transistor Q1. The inverting input terminal of the comparator 20 is coupled to the positive terminal of the voltage supply that supplies the voltage V2. The non-inverting input terminal may be a control terminal CONT through which a control signal is input. The output terminal of the comparator 20 is coupled to the non-inverting input terminal of the comparator 10. Other elements may be substantially the same as those in FIG. 6. In the semiconductor apparatus illustrated in FIG. 9, elements that are substantially the same as those in FIG. 6 are denoted by the same reference symbols, and the descriptions thereof may be omitted or reduced.

When a control signal input through the control terminal CONT is at a low level, the output of the comparator 20 is at the voltage level of a collector E. Hence, the semiconductor apparatus illustrated in FIG. 9 operates as a diode similarly to the semiconductor apparatus illustrated in FIG. 6. When the control signal input through the control terminal CONT is at a high level, the output level of the comparator 20 becomes high, whereby a high-level signal is applied to the non-inverting input terminal of the comparator 10. Hence, the transistor Q1 is turned on, and a collector C and the collector E conduct.

When the semiconductor apparatus illustrated in FIG. 9 is applied in the drive circuit for the three-phase motor illustrated in FIG. 7, the following configuration is employed. The semiconductor apparatus illustrated in FIG. 9 is abbreviated with a power semiconductor apparatus. That is, three series circuits, in each of which two power semiconductor apparatuses are coupled in series, are coupled in parallel (in bridge fashion across) between two terminals of a power supply with a high voltage V10. And, coils for each of the phases (U phase, V phase, W phase) of the three-phase motor are coupled at each of the coupling nodes between the two power semiconductor apparatuses in the three series circuits. Further, this drive circuit outputs a control signal (external control signal) to a control terminal Cont coupled to the non-inverting input terminals of the comparators 20 of these power semiconductor apparatuses. This power semiconductor apparatus may be applied not to a three-phase motor, but to motors with various multiple phases. In this case, a plurality of series circuits, in each of which two power semiconductor apparatuses are coupled in series, are coupled in parallel between two terminals of a power supply. And, each of coupling nodes between the two power semiconductor apparatuses in the plurality of series circuits are coupled to coils for each phase of a multiphase motor. Further, this multiphase motor driving circuit outputs control signals to the comparators 20 of these power semiconductor apparatuses.

Since the semiconductor apparatus illustrated in FIG. 9 operates as a diode when the control signal input through the control terminal CONT is at a low level and conducts when the control signal CONT is at a high level, may operate, the semiconductor apparatus operates as a circuit in which the IGBT and diode illustrated in FIG. 8 are coupled in parallel with one another. Referring to FIG. 8, a current flows through the IGBT or the diode in accordance with the direction of the flow. The IGBT and the diode D may have sizes in accordance with the permissible currents. As for the maximum applied voltage at the time when the IGBT is in an off state, the IGBT and the diode D may have substantially the same withstand voltage. In the semiconductor apparatus illustrated in FIG. 9, a high voltage is applied to the transistors Q2 and Q3 corresponding to high-voltage HEMTs, and a low voltage is applied to the transistor Q1. Since a current flows through the transistors Q1 and Q2 irrespective of the direction of the current, devices may be reduced in size. Compared with the circuit illustrated in FIG. 8, the semiconductor apparatus illustrated in FIG. 9 has lower resistance, resulting in a reduction in heat radiation. When the semiconductor apparatus illustrated in FIG. 9 is used to drive for the motor of a hybrid automobile, the heat radiation system may be simplified, leading to a reduction in weight and size.

Figure 10:
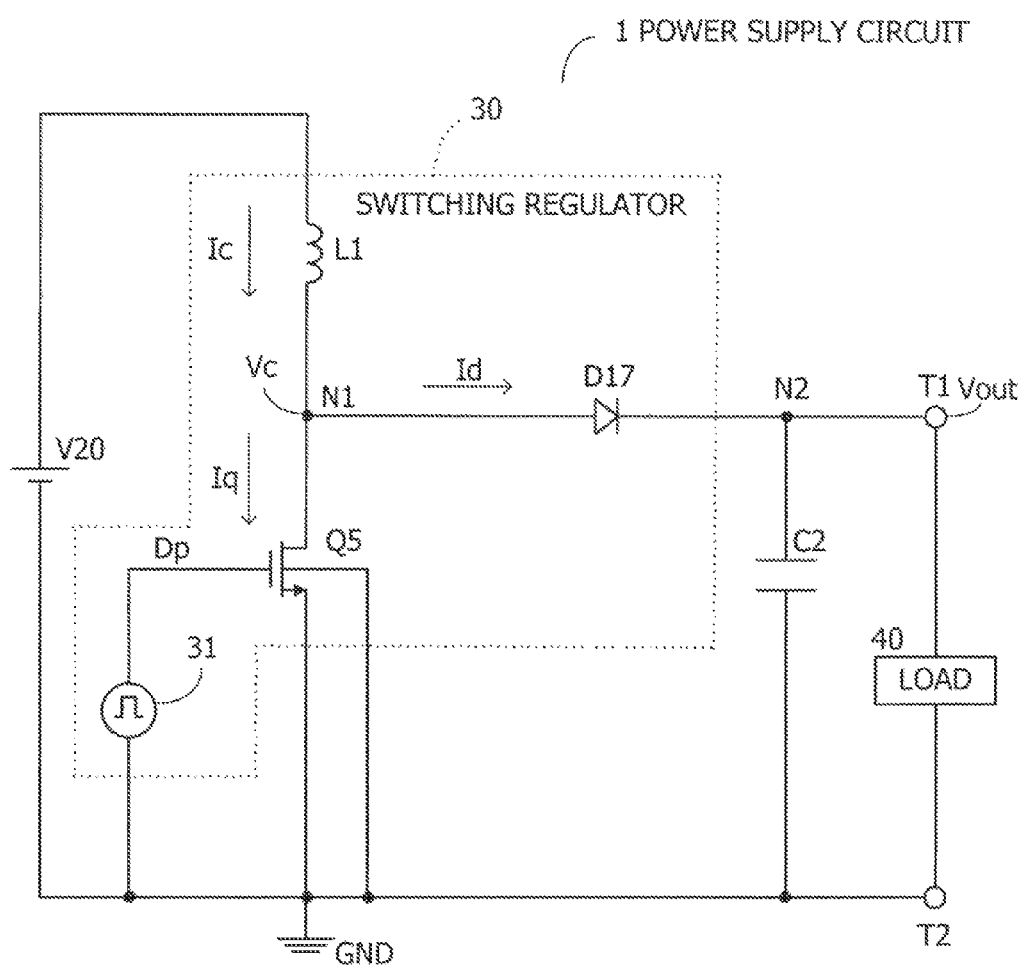
FIG. 10 illustrates a power supply circuit to explain a sixth embodiment.

FIG. 10 is a circuit diagram illustrating an example of a power supply circuit, to explain a sixth embodiment. The power supply circuit 1 comprises a step-up switching regulator 30, a capacitor C2 which accumulates as charge a portion of the current output by the switching regulator 30, and terminals T1 and T2 coupled to a load 40.

The switching regulator 30 comprises a coil (inductor) L1, a terminal of which is coupled to a voltage source which supplies a voltage V20, a transistor Q5 provided between another terminal of coil L1 and a reference power supply (reference voltage), such as for example ground GND, and the coil L1, a diode D17 the anode of which is coupled to a coupling node N1 of the coil L1 and transistor Q5, and a pulse generation circuit 31 which generates driving pulses for driving the transistor Q5.

The transistor Q5 is for example an NMOS transistor; in the following explanation it is assumed that the transistor Q5 is an NMOS transistor. The drain of the transistor Q5 is coupled to the other end of the coil L1, and the source is coupled to ground GND. The pulse generation circuit 31 outputs in alternation a high-level conducting pulse to put the transistor Q5 into the conducting state, and a low-level non-conducting pulse to put the transistor Q5 into the non-conducting state. The coil L1 receives current from the voltage source which supplies the voltage V20 during conduction of the transistor Q5, accumulates magnetic energy, and discharges this accumulated magnetic energy as a current during non-conduction of the transistor Q5. The diode D17 is a diode for rectification, the anode of which is coupled to the coupling node N1 and the cathode of which is coupled to a coupling node N2.

Figure 11:
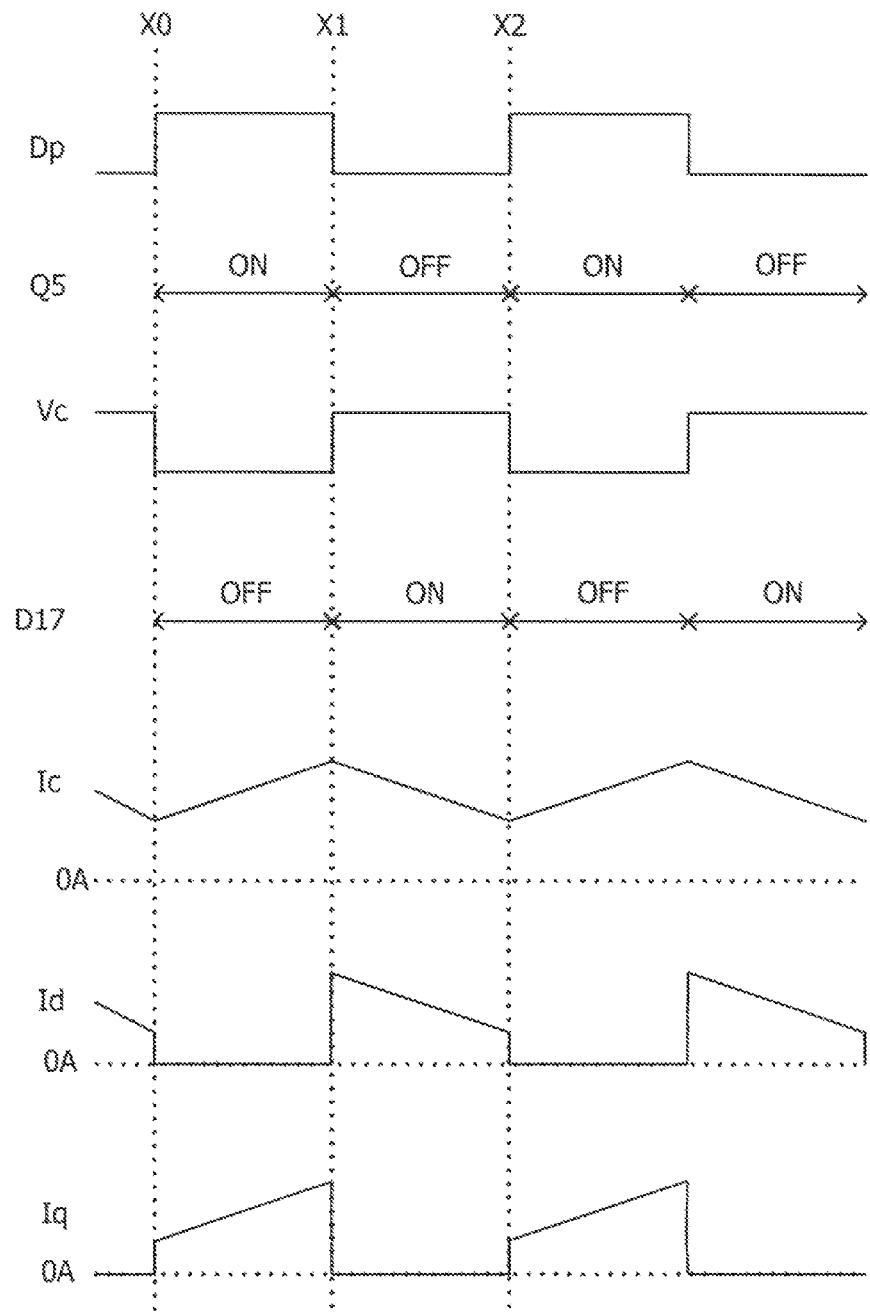
FIG. 11 explains operation of the power supply circuit of FIG. 10.

FIG. 11 explains operation of the power supply circuit 1 of FIG. 10; illustrated in order from above are the driving pulse Dp output by the pulse generation circuit 31, the transistor Q5 on/off state, the voltage Vc at the coupling node N1, the diode D17 on/off state, the current Ic flowing in the coil L1, the current Id flowing in the diode D17, and the current Iq flowing in the transistor Q5.

Below, operation of the power supply circuit 1 of FIG. 10 is explained, referring to FIG. 11. First, operation of the power supply circuit 1 in the interval from time X0 to time X1 in FIG. 11 is explained. When the pulse generation circuit 31 outputs a high-level driving pulse Dp to the transistor Q5, the transistor Q5 enters the on state (conducting state) due to this high-level driving pulse Dp. At this time, the voltage Vc at the coupling node N1 is at ground level GND. Further, the output voltage Vout at the terminal T1 is at a voltage higher than the voltage at the coupling node N1 (ground level GND) due to charge accumulated on the capacitor C2. As a result, the diode D17 is reverse-biased, and the diode D17 enters the off state. Further, when the transistor Q5 enters the on state, current flows to the coil L1 from the voltage source supplying the voltage V20, and the coil L1 accumulates magnetic energy. At this time the current Ic in the coil L1 rises, and moreover the current Id becomes 0 A and the current Iq rises. While the transistor Q5 is in the on state, that is, while the current Id is 0 A, the load 40 operates due to charge already accumulated on the capacitor C2.

Next, operation in the interval from time X1 to time X2 in FIG. 11 is explained. When the pulse generation circuit 31 outputs a low-level driving pulse Dp to the transistor Q5, the transistor Q5 enters the off state (non-conducting state) due to this low-level driving pulse Dp. Then, a reverse emf E' occurs across the terminals of the coil L1. The voltage Vc at the coupling node N1 at this time rises rapidly (voltage rise). If the voltage of the voltage V20 is E and the reverse emf of the coil L1 is E', then the voltage Vc is "E+E'."

Due to this rise of the voltage Vc, the diode D17 enters the on state, and current begins to flow from the anode toward the cathode of the diode D17. As a result, the coil current Ic flows as the current Id, and the current Iq becomes 0 A. Then, the coil current Ic occurring due to the reverse emf E' of the coil L1 gradually declines, and the current Id also declines. At this time, the current Id accumulates as charge on the capacitor C2, and is supplied to the load 40 via the terminal T1. If the voltage of the voltage V20 is E, the reverse emf of the coil L1 is E', and the forward-direction voltage drop across the diode D17 is Vf, then the output voltage Vout is "E+E'−Vf."

In this way, the pulse generation circuit 31 outputs high-level conducting pulses and low-level non-conducting pulses to the transistor Q5, and by this means causes the transistor Q5 to repeatedly be conducting and non-conducting, supplies a current Id to the side of the output terminal T1 by means of magnetic energy accumulated in the coil L1, and steps up the output voltage Vout to the voltage V20.

Figure 12:
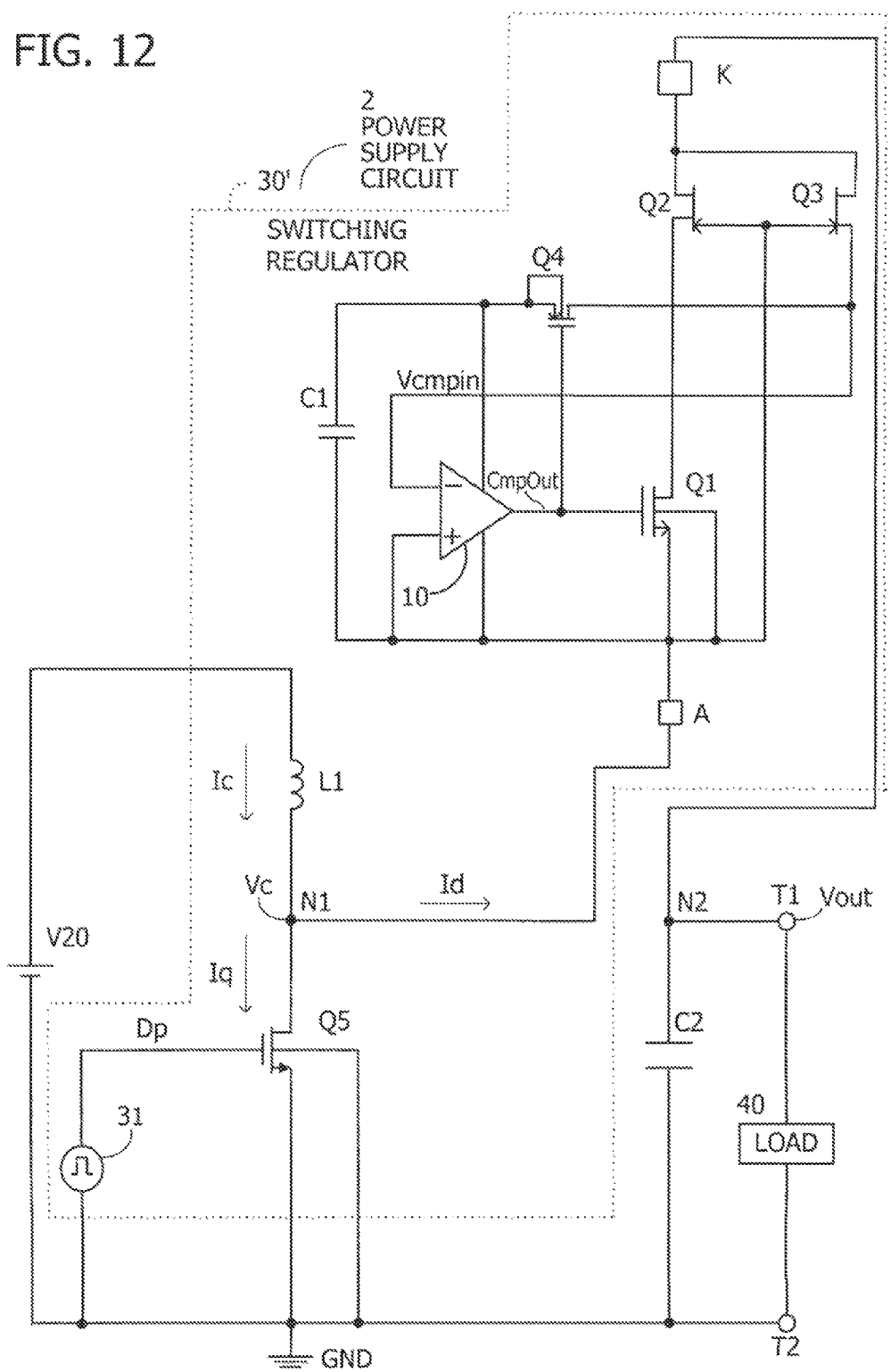
FIG. 12 illustrates a power supply circuit in which a diode provided in the power supply circuit of FIG. 10 is replaced with the semiconductor apparatus explained in FIG. 3.

FIG. 12 illustrates a circuit diagram of the power supply circuit 2, in which the diode D17 provided in the power supply circuit 1 of FIG. 10 is replaced with the semiconductor apparatus explained in FIG. 3. This replacement is to reduce power loss due to the forward-direction voltage drop across the diode D17. In the switching regulator 30' of FIG. 12, the anode A of the semiconductor apparatus explained in FIG. 3 is coupled to the coupling node N1, and the cathode K is coupled to the coupling node N2. Otherwise the configuration is similar to that of the power supply circuit 1 explained in FIG. 10, and so in FIG. 12, portions corresponding to portions in FIG. 10 are assigned the same symbols, and explanations are omitted.

If the diode D17 is replaced with the semiconductor apparatus of FIG. 3 in this way, when the semiconductor apparatus changes from the on state to the off state, a reverse current flows in the direction from the cathode K to the anode A. Then, this reverse current is absorbed by ground GND, and power for supply to the capacitor C2 and load 40 is lost.

Figure 13:
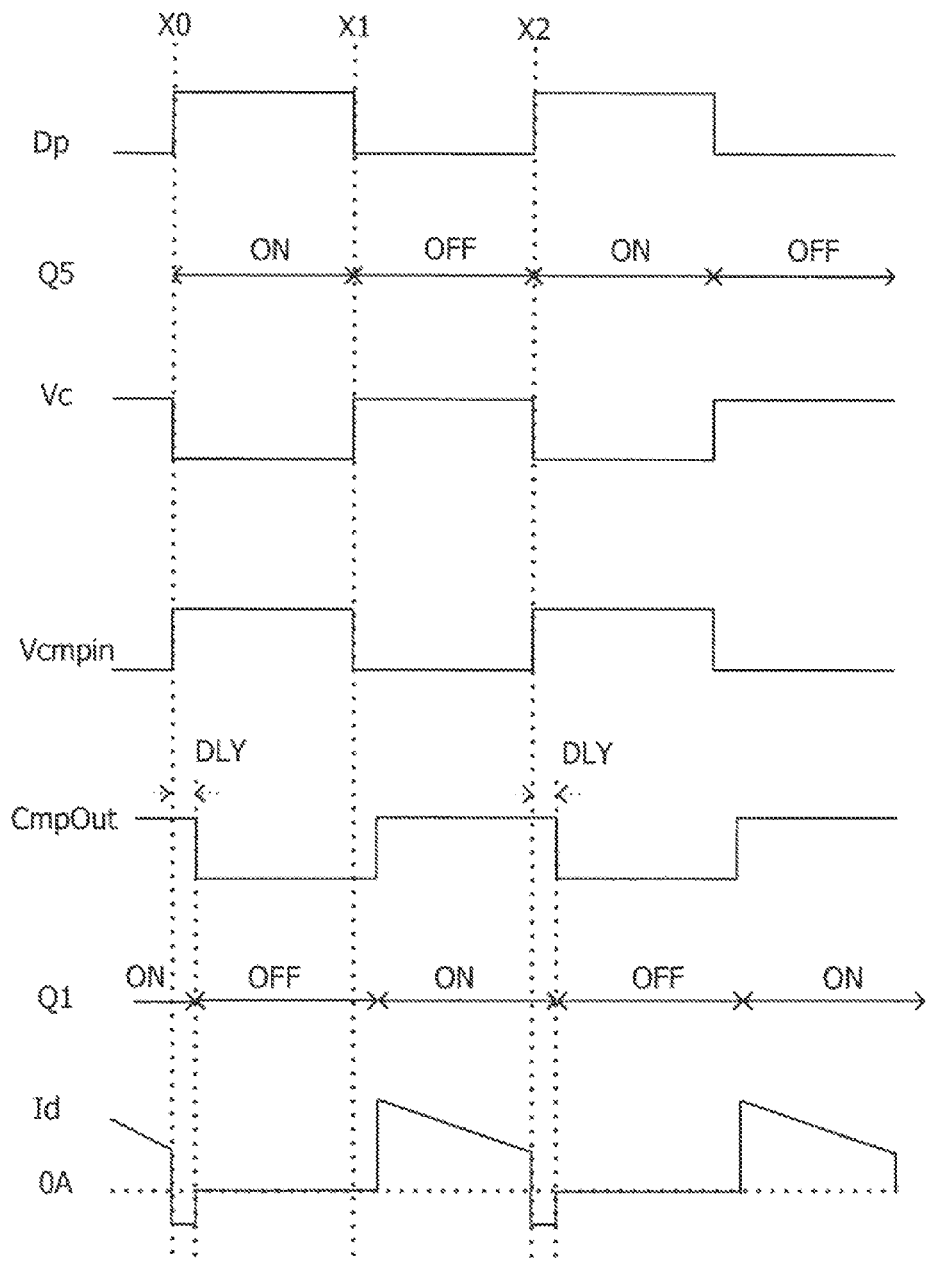
FIG. 13 explains a reason for flow of a reverse current.

FIG. 13 explains a reason for the flow of this reverse current; in order from above are the driving pulse Dp output by the pulse generation circuit 31, the transistor Q5 on/off state, the voltage Vc at the coupling node N1, the voltage Vcmpin applied to the inverting input terminal of the comparator 10, the comparison signal CmpOut output by the comparator 10, the transistor Q1 on/off state, and the current Id.

First, operation of the power supply circuit 2 in the interval from time X0 to time X1 in FIG. 13 is explained. When the pulse generation circuit 31 of FIG. 12 outputs a high-level driving pulse Dp to the transistor Q5, the transistor Q5 enters the on state due to this high-level driving pulse Dp, and the voltage Vc at the coupling node N1 goes to ground GND. Further, the voltage at the coupling node N2 (output voltage Vout) is at a higher voltage than ground GND due to charge accumulated on the capacitor C2. That is, ground voltage is applied to the anode A coupled to the coupling node N1, and a higher voltage than ground GND is applied to the cathode K coupled to the coupling node N2.

Then, as explained in FIG. 1, the voltage Vcmpin corresponding to the threshold voltage Vth1 of the transistors Q2 and Q3 is applied to the inverting input terminal of the comparator 10 of FIG. 12. Because the voltage applied to the non-inverting input terminal (ground GND) is lower than the voltage Vcmpin applied to the inverting input terminal, the comparator 10 outputs a low-level comparison signal CmpOut.

However, the timing with which this low-level comparison signal CmpOut is output is not the same as the timing with which the voltage Vcmpin is applied to the inverting input terminal of the comparator 10, but is slightly delayed, as indicated by the symbol DLY. This delay is a time delay of approximately several tens of nanoseconds. This delay necessarily occurs due to the characteristics of the comparator, which is an analog circuit, and shortening this delay is extremely difficult.

During this delay DLY, the comparator 10 continues to output the high-level comparison signal CmpOut as indicated in FIG. 13, and the transistor Q1 remains in the on state. During this interval, a reverse current flows from the cathode K to the anode A. This reverse current is absorbed by ground GND, and as a result power for supply to the capacitor C2 and load 40 is lost.

Although the reverse current flows for a very short interval of several tens of nanoseconds, the power loss due to this reverse current may not be neglected for the following reason. That is, with the increasing need at present to miniaturize power supply circuits mounted on electronic equipment, in order to achieve miniaturization of power supply circuits, the coil L1 is miniaturized. In order to miniaturize the coil L1 and moreover step up the input voltage to a prescribed output voltage, the frequency of driving pulses Dp generated by the pulse generation circuit 31 is raised, and the period of the driving pulses Dp is shortened. For this reason, the frequency of the driving pulses Dp is raised from hundreds of kHrz to several MHz, and the period of the driving pulses Dp is shortened. For example, if the frequency of the driving pulses Dp is 1 MHz, then the period of the driving pulses Dp is shortened to 1 µs.

If the frequency of driving pulses Dp is raised and the period shortened in this way, when in one period of the driving pulses Dp the transistor Q1 switches from the on state to the off state, if a reverse current flows even for several tens of nanoseconds and power loss occurs in one period of the driving pulses Dp, the total power loss due to reverse currents during the interval in which the power supply circuit is operating becomes too large to ignore. Hence in the sixth embodiment, a semiconductor apparatus in FIG. 3 was added to the technical means to reliably reduce this reverse current.

Figure 14:
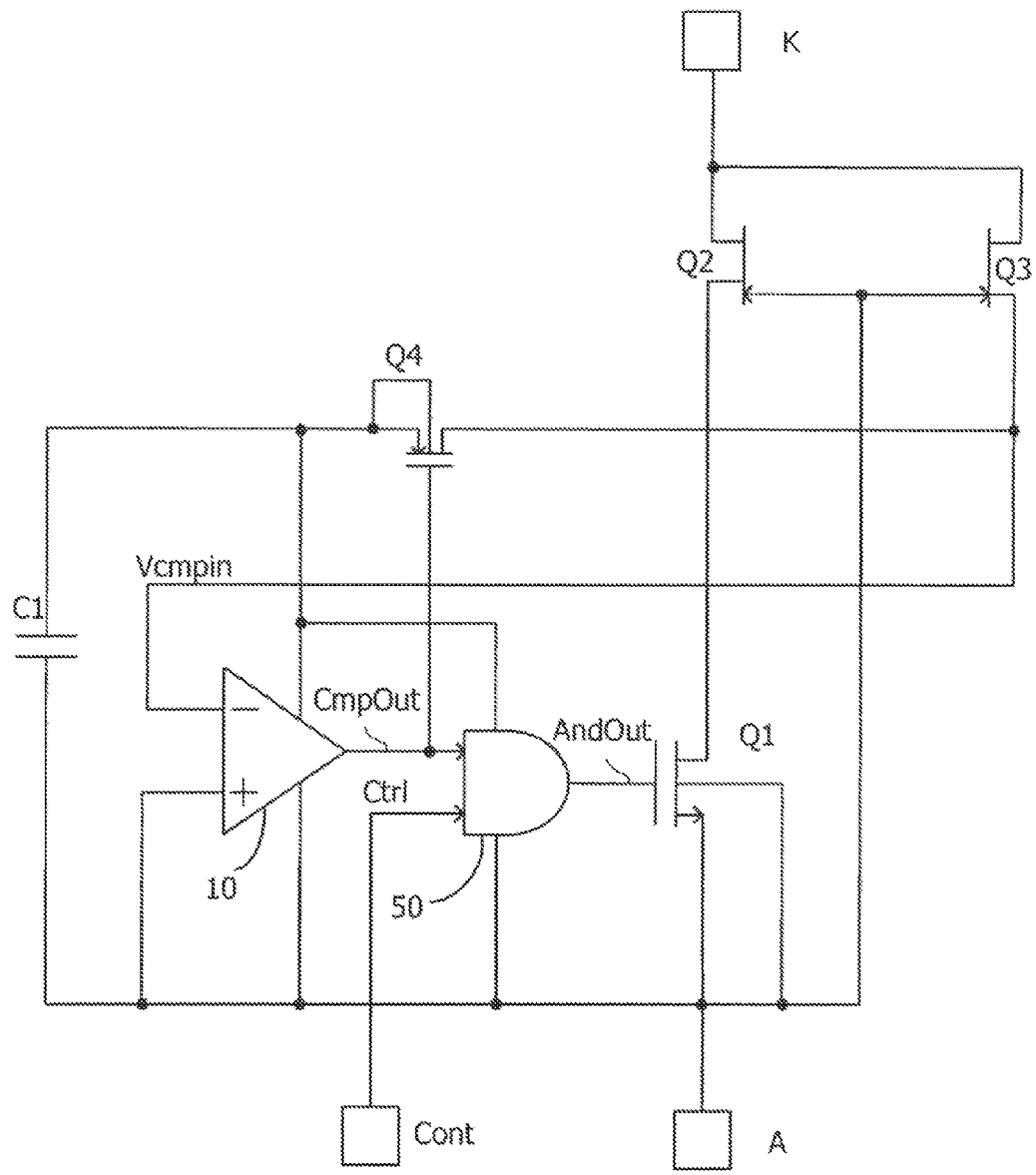
FIG. 14 illustrates the circuit of the sixth embodiment.

FIG. 14 illustrates the circuit diagram of the sixth embodiment. In the sixth embodiment, a logic circuit, such as an AND circuit 50, is provided between the comparator 10 and the gate of the transistor Q1. The logic circuit changes the comparison signal (control signal) CmpOut output by the comparator 10 from a first level for conducting transistor Q1 into a second level for non-conducting transistor Q1, in response to an external control signal Ctrl input to the control terminal Cont from an external circuit, in order to reduce flow of the above-described reverse current. The first level is a high level at which the transistor Q1 is conducting, and the second level is a low level at which the transistor Q1 is non-conducting.

The AND circuit 50 takes as inputs the comparison signal CmpOut from the comparator 10 and the control signal Ctrl from the control terminal Cont, takes the logical product of the voltage of the comparison signal CmpOut and the voltage of the control signal Ctrl, and outputs the result, as an output signal AndOut, to the gate of the transistor Q1. The power necessary for operation of the AND circuit 50 is supplied from the capacitor C1, as explained in FIG. 1. Otherwise the configuration is similar to that of the semiconductor apparatus explained in FIG. 3, and so in FIG. 14, portions corresponding to portions in FIG. 3 are assigned the same symbols, and explanations are omitted. The above-described logic circuit may be added to the semiconductor apparatus of FIG. 1, FIG. 4 or similar, instead of to the semiconductor apparatus of FIG. 3.

Figure 15:
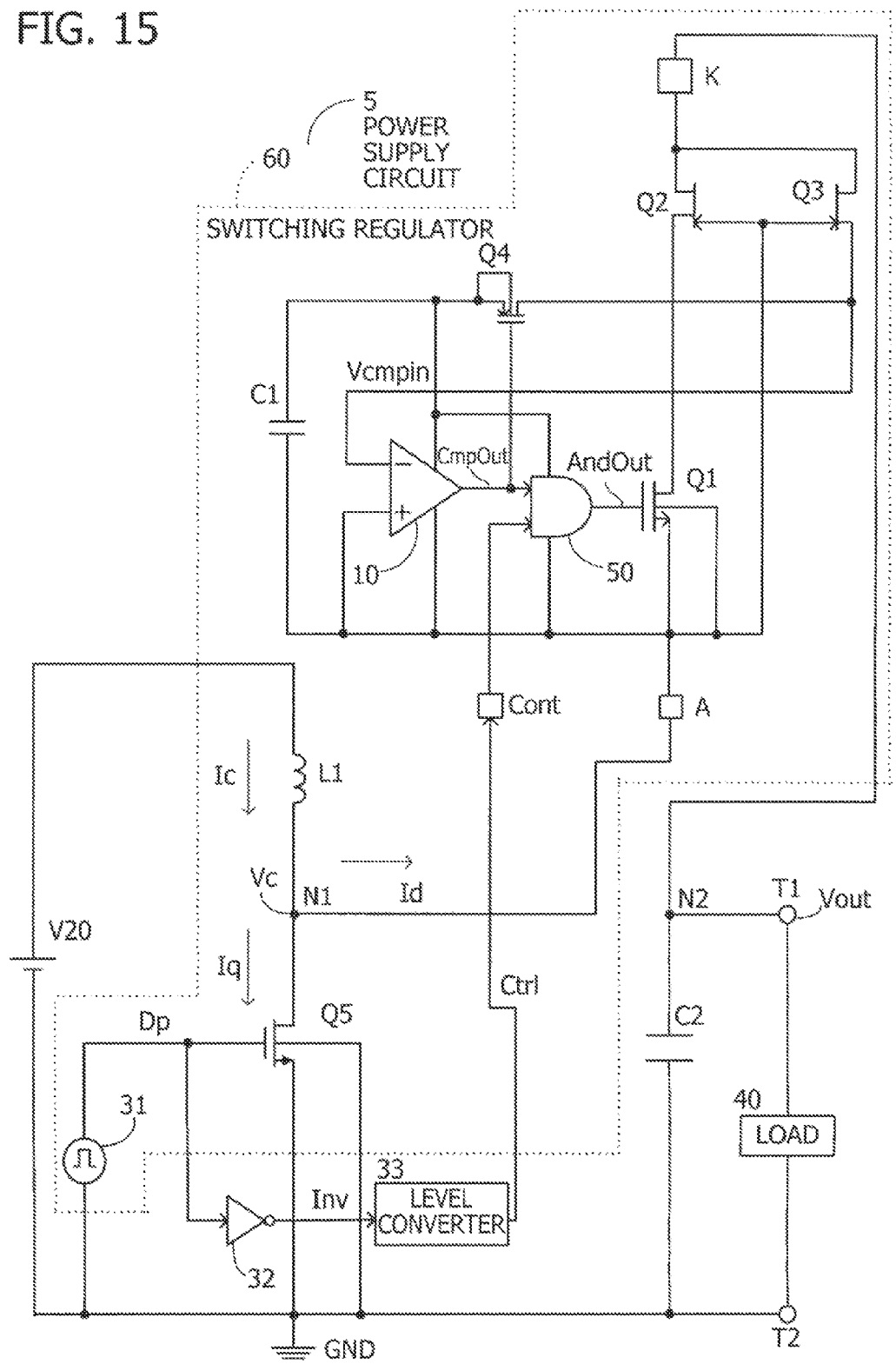
FIG. 15 illustrates a power supply circuit in which a diode provided in the power supply circuit of FIG. 10 is replaced with the semiconductor apparatus explained in FIG. 14.

FIG. 15 is a circuit diagram of a power supply circuit 5, illustrating a configuration in which the semiconductor apparatus (high-withstand voltage diode) of FIG. 3 in the power supply circuit 2 of FIG. 12 is replaced with the semiconductor apparatus of FIG. 14. In the switching regulator 60 of the power supply circuit 5, the semiconductor apparatus of FIG. 14 is provided between an output terminal T1 and the coupling node N1. That is the anode A of the semiconductor apparatus of FIG. 14 is coupled to the coupling node N1, the cathode K is coupled to the coupling node N2, and inverted pulses of the driving pulses Dp of the pulse generation circuit 31 are input, via a level converter 33, to the control terminal Cont.

Further, the power supply circuit 5 of FIG. 15 comprises, in addition to the configuration of the power supply circuit 2 of FIG. 12, an inverter 32 which outputs to a level converter 33 inverted pulses Inv obtained by inverting the driving pulses Dp generated by the pulse generation circuit 31, and the level converter 33 which converts (raises) the voltage level of the inverted pulses Inv and outputs the result, as a external control signal Ctrl, to the control terminal Cont. That is, the external control signal Ctrl is generated based on the driving pulses Dp. The external control signal Ctrl is input to the semiconductor apparatus AND circuit 50 (logic circuit) of FIG. 14.

The reason for providing the level converter 33 is explained below. The comparator 10 operates by means of charge stored on the capacitor C1 and outputs the comparison signal CmpOut, but the voltage level of this comparison signal CmpOut is higher than the voltage level of the driving pulses Dp generated by the pulse generation circuit 31. Hence the level converter 33 raises the voltage level of inverted pulses Inv of the driving pulses Dp and outputs the result as the control signal Ctrl to the AND circuit 50. By this means, the AND circuit 50 may take the logical product of the voltage of the comparison signal CmpOut and the voltage of the control signal Ctrl. Further, a voltage from the voltage source which supplies the voltage V20 is supplied to the inverter 32, and a voltage from for example a voltage source, not illustrated, is supplied to the level converter 33. Otherwise the configuration is similar to that of the power supply circuit 1 explained in FIG. 10, and so in FIG. 15, portions which are the same as corresponding portions in FIG. 10 are assigned the same symbols, and explanations are omitted.

FIG. 16 explains operation of the power supply circuit 5 of FIG. 15; illustrated in order from above are the driving pulse Dp output by the pulse generation circuit 31, the transistor Q5 on/off state, the voltage Vc at the coupling node N1, the voltage Vcmpin applied to the inverting input terminal of the comparator 10, the comparison signal CmpOut output by the comparator 10, the control signal Ctrl, the output signal AndOut of the AND circuit 50, and the transistor Q1 on/off state.

Below, operation of the power supply circuit 5 of FIG. 15 is explained referring to FIG. 16. First, operation of the power supply circuit 5 in the interval from time X0 to time X1 in FIG. 16 is explained. As explained in FIG. 13, when the pulse generation circuit 31 outputs a high-level driving pulse Dp to the transistor Q5, after a delay DLY from the timing with which a voltage Vcmpin corresponding to the threshold voltage Vth1 of the transistor Q3 is applied to the inverting input terminal of the comparator 10, the comparator 10 outputs a low-level comparison signal CmpOut to the AND circuit 50. However, a low-level external control signal Ctrl, which is the inverted pulse of the high-level driving pulse Dp, is input to the AND circuit 50 with the timing of the output by the pulse generation circuit 31 of the high-level driving pulse Dp to the transistor Q5.

The AND circuit 50 takes the logical product of the voltage of the comparison signal CmpOut and the (low-level) voltage of the control signal Ctrl, and outputs a low-level output signal AndOut to the gate of the transistor Q1. As a result, at the delay time DLY the transistor Q1 enters the off state, so that flow of a reverse current from the cathode K toward the anode A, described above, may be reduced.

In this way, the transistor Q1 is forced into the off state based on a control signal from an external circuit, so that a reverse current which flows when the semiconductor apparatus functioning as a rectifying element switches from the on state to the off state may be reduced.

Next, operation in the interval from time X1 to time X2 in FIG. 16 is explained. In this case also, as explained in FIG. 11, when the pulse generation circuit 31 outputs a low-level driving pulse Dp to the transistor Q5, the transistor Q5 enters the off state (non-conducting state) due to the low-level driving pulse Dp, and the voltage Vc rises. Then, the voltage of the cathode K of the semiconductor apparatus of FIG. 15 declines relative to the anode A. As a result, as explained in FIG. 1, a negative voltage Vcmpin is applied to the inverting input terminal of the comparator 10 of FIG. 15, and the comparator 10 outputs a high-level comparison signal CmpOut to the AND circuit 50. Further, a high-level external control signal Ctrl, which is the inverted pulse of the low-level driving pulse Dp, is input to the AND circuit 50 with the timing of the output by the pulse generation circuit 31 of the low-level driving pulse Dp to the transistor Q5.

And, the AND circuit 50 outputs the high-level output signal AndOut to the gate of the transistor Q1. Then the transistor Q1 enters the on state, and the current Id flows in the load 40. The time over which the transistor Q1 is in the on state is shortened by the delay time DLY, but as explained above, this shortened time is short, approximately several tens of nanoseconds, and so instability in the power supplied to the load 40 is avoided.

A high-voltage and low-resistance diode and a high-voltage and low-resistance switch may be provided by cascading the high-voltage transistor Q2 and the low-voltage transistor Q1.

For example, the transistors Q2 and Q3 may be HEMTs corresponding to a wide band gap semiconductor such as gallium nitride (GaN) or may be other depletion mode transistors having a high-voltage characteristic.

Further, the comparator 10,20 may be an operational amplifier (op-amp). For example, the comparators 10 in the fourth embodiment and fifth embodiment may be op-amps.

By means of the disclosed embodiments, a transistor with a high withstand voltage and a transistor with a low withstand voltage may be combined to realize a diode and switch with high withstand voltage and low resistance.

In the semiconductor apparatus illustrated in FIG. 4, the source voltages of monitoring transistors Q3 coupled in multiple stages may be adjusted.

All examples and conditional language recited herein are intended for pedagogical objects to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment(s) of the present inventions have been described in detail, it should be understood that the various changes, substitutions, and alterations could be made hereto without departing from the spirit and scope of the invention.

The invention claimed is:

1. A semiconductor apparatus comprising:
   a first transistor;
   a second transistor having a higher withstand voltage than the first transistor, a source of the second transistor coupled to a drain of the first transistor, a gate of the second transistor coupled to a source of the first transistor;
   a third transistor having a higher withstand voltage than the first transistor and a drain of the third transistor coupled to a drain of the second transistor; and
   a comparator that compares a source voltage of the first transistor with a source voltage of the third transistor, and controls a first gate voltage of the first transistor.

2. The semiconductor apparatus according to claim 1, wherein the second transistor includes a depletion mode transistor and the third transistor includes a depletion mode transistor.

3. The semiconductor apparatus according to claim 1, wherein
   a rectifier device includes the first and second transistors,
   wherein the source of the first transistor corresponds to an anode of the rectifier device, and
   wherein the drain of the second transistor corresponds to a cathode of the rectifier device.

4. The semiconductor apparatus according to claim 1, wherein a first power input terminal of the comparator is coupled to the source of the first transistor.

5. The semiconductor apparatus according to claim 4, further comprising:
   a fourth transistor coupled between the source of the third transistor and a second power input terminal of the comparator, a second gate voltage of the fourth transistor being controlled by the comparator; and
   a capacitor coupled between the first and second power input terminals of the comparator.

6. The semiconductor apparatus according to claim 4, further comprising:
   a diode coupled between the source of the third transistor and a second power input terminal of the comparator; and
   a capacitor coupled between the first and second power input terminals of the comparator.

7. The semiconductor apparatus according to claim 1, wherein a gate of the third transistor is coupled to the source of the second transistor.

8. The semiconductor apparatus according to claim 1, wherein a gate of the third transistor is coupled to the gate of the second transistor.

9. The semiconductor apparatus according to claim 1, wherein at least one of the second transistor and the third transistor includes a high electron mobility transistor.

10. The semiconductor apparatus according to claim 1, wherein the first transistor includes a silicon MOSFET.

11. The semiconductor apparatus according to claim 1, further comprising:
    a first voltage source, a negative terminal of the first voltage source coupled to the source of the first transistor, wherein the first voltage source outputs a voltage, which is obtained by adding a first voltage to a source voltage of the first transistor, to a positive terminal of the first voltage source; and
    voltage divider resistors coupled in series between the source of the third transistor and the positive terminal of the first voltage source,
    wherein one input terminal of the comparator is coupled to a divided voltage node of the voltage divider resistors.

12. The semiconductor apparatus according to claim 1, wherein the source of the first transistor is coupled to a non-inverting terminal of the comparator, and a source of the third transistor is coupled to an inverting terminal of the comparator.

13. The semiconductor apparatus according to claim 1, wherein the third transistor has a smaller size than the second transistor.

14. The semiconductor apparatus according to claim 1, wherein the comparator is an operational amplifier.

15. The semiconductor apparatus according to claim 5, further comprising:
    a logic circuit, provided between the comparator and a gate of the first transistor, which changes a control signal output by the comparator from a first level for conducting the first transistor into a second level for non-conducting the first transistor, in response to an external control signal.

16. A switching regulator, comprising:
    a coil, a terminal of which is coupled to a voltage source;
    a fifth transistor provided between another terminal of the coil and a reference power supply;

the semiconductor apparatus according to claim 15, provided between an output terminal and a coupling node between the coil and the fifth transistor; and a pulse generation circuit, which generates driving pulses for driving the fifth transistor, wherein the external control signal is generated based on the driving pulses.

17. A semiconductor apparatus comprising:

a first transistor;

a second transistor having a higher withstand voltage than the first transistor, a source of the second transistor coupled to a drain of the first transistor, a gate of the second transistor coupled to a source of the first transistor;

a third transistor having a higher withstand voltage than the first transistor and a drain of the third transistor coupled to a drain of the second transistor;

a first voltage source, a negative terminal of the first voltage source coupled to the source of the first transistor, wherein the first voltage source outputs a first output voltage, which is obtained by adding a first voltage to a source voltage of the first transistor, to a positive terminal of the first voltage source;

voltage divider resistors coupled in series between a source of the third transistor and the positive terminal of the first voltage source;

a second voltage source, a negative terminal of the second voltage source coupled to the source of the first transistor, wherein the second voltage source outputs a second output voltage, which is obtained by adding a second voltage to the source voltage of the first transistor, to a positive terminal of the second voltage source;

a first comparator that compares a voltage of a control signal input through a control terminal with the second output voltage, to output a third output voltage; and a second comparator that compares the third output voltage with a divided voltage of the voltage divider resistors, and controls a gate voltage of the first transistor.

18. The semiconductor apparatus according to claim 17, wherein the second transistor includes a depletion mode transistor and the third transistor includes a depletion mode transistor.

19. The semiconductor apparatus according to claim 17, wherein a switching device includes the first transistor, the second transistor, the third transistor, the first voltage source, the voltage divider resistors, the second voltage source, the first comparator, and the second comparator, wherein the source of the first transistor corresponds to a first terminal of the switching device, and wherein the drain of the second transistor corresponds to a second terminal of the switching device.

20. A drive circuit for a multiphase motor, wherein a plurality of series circuits, in each of which two semiconductor apparatuses according to claim 17 are coupled in series, are coupled in parallel between two terminals of a power supply, wherein each of coupling nodes between the two semiconductor apparatuses in the plurality of series circuits are coupled to coils for each phase of the multiphase motor, and a plurality of control signals are input to the first comparators of the semiconductor apparatuses, respectively.

21. The semiconductor apparatus according to claim 17, wherein the third transistor has a smaller size than the second transistor.

22. The semiconductor apparatus according to claim 17, wherein the first comparator is a first operational amplifier and the second comparator is a second operational amplifier.

* * * * *